United States Patent
Matsui

(10) Patent No.: US 9,281,161 B2
(45) Date of Patent: Mar. 8, 2016

(54) ELECTRON BEAM WRITING APPARATUS AND ELECTRON BEAM WRITING METHOD

(71) Applicant: NuFlare Technology, Inc., Yokohama-shi (JP)

(72) Inventor: Hideki Matsui, Yokohama (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 14/614,948

(22) Filed: Feb. 5, 2015

(65) Prior Publication Data

US 2015/0332890 A1 Nov. 19, 2015

(30) Foreign Application Priority Data

May 13, 2014 (JP) ................................. 2014-099725

(51) Int. Cl.
| | |
|---|---|
| H01J 37/305 | (2006.01) |
| H01L 21/027 | (2006.01) |
| H01J 37/147 | (2006.01) |
| H01J 37/317 | (2006.01) |

(52) U.S. Cl.
CPC ........... *H01J 37/147* (2013.01); *H01J 37/3174* (2013.01)

(58) Field of Classification Search
CPC ............ H01J 37/3174; H01J 37/31776; H01J 37/31764; H01J 37/3026; H01J 37/3175; H01J 37/1472; H01J 37/265; H01J 37/3007; H01J 37/304; H01J 3/12; G03F 7/2059; G03F 1/20
USPC ................ 250/492.2, 492.23, 492.22, 396 R, 250/492.3, 396 ML, 397, 492.1; 382/199, 382/141, 173
See application file for complete search history.

(56) References Cited

U.S. PATENT DOCUMENTS

| | | | | |
|---|---|---|---|---|
| 4,445,040 A | * | 4/1984 | Iwasaki | H01J 37/09 250/492.2 |
| 4,524,278 A | * | 6/1985 | Le Poole | B82Y 10/00 250/398 |
| 4,914,304 A | * | 4/1990 | Koyama | B82Y 10/00 219/121.25 |
| 5,047,646 A | * | 9/1991 | Hattori | H01J 37/153 250/396 ML |

(Continued)

FOREIGN PATENT DOCUMENTS

| | | |
|---|---|---|
| JP | 2003 77821 | 3/2003 |
| JP | 2007 43078 | 2/2007 |

(Continued)

*Primary Examiner* — David A Vanore
(74) *Attorney, Agent, or Firm* — Oblon, McClelland, Maier & Neustadt, L.L.P.

(57) ABSTRACT

An electron beam writing apparatus includes: a first aperture plate that shapes an electron beam emitted from an electron gun assembly; a second aperture plate onto which an electron beam of an aperture plate image passing through the first aperture plate is projected; and a first shaping deflector and a second shaping deflector which are provided between the first aperture plate and the second aperture plate, respectively, deflect an electron beam, control an irradiation position of the aperture plate image on the second aperture plate, and determine a shot shape and a shot size. The first shaping deflector deflects an electron beam such that the aperture plate image is positioned at a determined position in accordance with a shot shape and a shot size. The second shaping deflector deflects an electron beam deflected by the first shaping deflector and controls formation of a desirable shot size.

15 Claims, 7 Drawing Sheets

(56) References Cited

U.S. PATENT DOCUMENTS

| | | | | |
|---|---|---|---|---|
| 5,105,089 A * | 4/1992 | Yamada | B82Y 10/00 250/398 |
| 5,256,881 A * | 10/1993 | Yamazaki | B82Y 10/00 250/492.23 |
| 5,294,800 A * | 3/1994 | Chung | H01J 37/3026 250/492.22 |
| 6,275,604 B1 * | 8/2001 | Miyajima | B82Y 10/00 382/144 |
| 6,627,905 B1 * | 9/2003 | Hirayanagi | B82Y 10/00 250/492.22 |
| 6,753,540 B2 * | 6/2004 | Wakimoto | B82Y 10/00 250/492.23 |
| 7,205,557 B2 * | 4/2007 | Miyajima | B82Y 10/00 250/492.23 |
| 7,304,320 B2 * | 12/2007 | Nagano | B82Y 10/00 250/306 |
| 7,796,801 B2 * | 9/2010 | Kitamura | G06K 9/00 348/125 |
| 8,008,631 B2 * | 8/2011 | Nakayama | B82Y 10/00 250/396 R |
| 8,791,422 B2 * | 7/2014 | Touya | G21K 5/08 250/396 R |
| 8,803,108 B2 * | 8/2014 | Nishimura | H01J 37/3174 250/396 R |
| 8,847,178 B2 * | 9/2014 | Kawaguchi | G03F 9/7096 250/491.1 |
| 8,968,045 B2 * | 3/2015 | Saito | H01J 1/13 313/421 |
| 2007/0229337 A1 * | 10/2007 | Sanmiya | H03M 1/1071 341/144 |
| 2011/0031387 A1 * | 2/2011 | Nakayamada | B82Y 10/00 250/252.1 |
| 2011/0068281 A1 * | 3/2011 | Hara | B82Y 10/00 250/492.22 |
| 2012/0001097 A1 * | 1/2012 | Yashima | H01J 37/3174 250/492.22 |
| 2012/0252215 A1 * | 10/2012 | Abe | G03F 1/36 438/694 |
| 2013/0082193 A1 * | 4/2013 | Kawaguchi | G03F 9/7096 250/492.3 |
| 2013/0256555 A1 * | 10/2013 | Nakayama | H01J 3/12 250/396 R |
| 2014/0291553 A1 * | 10/2014 | Nakayamada | H01J 37/3174 250/492.3 |
| 2014/0319372 A1 * | 10/2014 | Asami | H01J 37/026 250/453.11 |
| 2015/0041684 A1 * | 2/2015 | Kato | H01J 37/3026 250/492.22 |
| 2015/0228455 A1 * | 8/2015 | Motosugi | H01J 37/3174 250/398 |

FOREIGN PATENT DOCUMENTS

| | | |
|---|---|---|
| JP | 2011 128478 | 6/2011 |
| JP | 2013 45876 | 3/2013 |

* cited by examiner

ELECTRON BEAM WRITING APPARATUS AND ELECTRON BEAM WRITING METHOD

CROSS-REFERENCE TO RELATED APPLICATION

This application is based upon and claims the benefit of priority from the prior Japanese Patent Application No. 2014-99725 filed on May 13, 2014, the entire contents of which are incorporated herein by reference.

FIELD

The present invention relates to an electron beam writing apparatus and an electron beam writing method.

BACKGROUND

Lithography technology that plays a key role in advancement of miniaturization of semiconductor devices is used to perform a significantly important process, in which a pattern is uniquely generated, among semiconductor manufacturing processes. In recent years, a design rule required for the semiconductor devices becomes finer year by year in accordance with high integration of LSI. In order to form a desirable circuit pattern for these semiconductor devices, a highly accurate original pattern (also referred to as a reticle or a mask) is needed. The highly accurate original pattern is produced using electron beam pattern writing technology in which high resolution is achieved.

An electron-beam pattern writing apparatus forms a shot having a size and a shape which are prepared depending on a figure pattern. Specifically, after an electron beam emitted from an electron gun assembly is shaped through a first shaping aperture plate into a rectangle, a deflector deflects the electron beam on a second shaping aperture plate. The beam shape and size is a target shape and size. Then, the electron beam is used in irradiating a sample disposed on a stage (for example, see Japanese Patent Application Publication No. 2007-43078 and Japanese Patent Application Publication No. 2013-45876). The electron beam passes through the first shaping aperture plate and the second shaping aperture plate so as to be formed into an electron beam having a certain shape and size.

Japanese Patent Application Publication No. 2013-45876 discloses an electron-beam pattern writing apparatus in which deflectors are disposed in two stages such that a shape of an electron beam is determined through deflection by the first deflector and a size of the electron beam is determined through deflection by the second deflector. In this electron-beam pattern writing apparatus, the first deflector produces a large deflection amount and operates at a low speed, while the second deflector produces a small deflection amount and operates at a high speed. Therefore, the order of shots is arranged according to beam shapes and settling time required for a digital-analog conversion (DAC) unit of the deflector is shortened. Accordingly, a pattern writing throughput is increased.

High current density is effective to shorten pattern writing time (shot time) of each shot. However, when a current is increased, inter-electron Coulomb interaction (Coulomb effect) causes beam resolution to deteriorate (blur) and a fine pattern cannot be formed. Therefore, the first shaping aperture plate size is limited and the maximum shot size is limited such that the current does not exceed a certain value.

In the electron-beam pattern writing apparatus, the maximum shot size becomes smaller in accordance with miniaturization of a pattern to be written. When a pattern for which high accuracy is not needed, such as a pattern for a peripheral circuit section, is written in a small shot size, the number of shots in total increases and time for writing the entire pattern increases.

Japanese Patent Application Publication No. 2007-43078 discloses that the first shaping aperture plate size is increased and pattern writing is performed for a pattern for which high accuracy is not needed, using a large shot size so as to shorten pattern writing time, and pattern writing is performed for a pattern for which high accuracy is needed, using a small shot size. Although it is considered that such a method is applied to the electron-beam pattern writing apparatus disclosed in Japanese Patent Application Publication No. 2013-45876, in the electron-beam pattern writing apparatus in which the deflectors are configured to form two stages so as to increase the pattern writing throughput, the second deflector that determines the size of the electron beam is designed to produce a small deflection amount. Therefore, a size of the maximum shot size determined by the size of the first shaping aperture plate is limited to a range of the shot size that can be changed through deflection by the second deflector and it is not possible for the maximum shot size to be greater than the range.

As above, in the related art, taking into account the deterioration of the beam resolution by the Coulomb effect and the deflection amount by the second deflector, the first shaping aperture plate size is limited and the maximum shot size becomes smaller. Therefore, problems arise in that the number of shots increases, pattern writing time for pattern writing of an entire pattern is increased, and the pattern writing throughput is decreased.

DETAILED DESCRIPTION

According to an embodiment, an electron beam writing apparatus includes an electron gun assembly that emits an electron beam so as to perform pattern writing of a pattern on a sample, a first aperture plate that shapes the electron beam, a second aperture plate onto which the electron beam of an aperture plate image passing through the first aperture plate is projected, and a first shaping deflector and a second shaping deflector which are provided between the first aperture plate and the second aperture plate, respectively, deflect the electron beam, control an irradiation position of the aperture plate image on the second aperture plate, and determine a shape and a shot size of the electron beam that passes through the second aperture plate. The first shaping deflector deflects an electron beam such that the aperture plate image is positioned at a determined position in accordance with a shape and a shot size of an electron beam with which the sample is irradiated. The second shaping deflector deflects an electron beam deflected by the first shaping deflector and controls formation of a desirable shot size.

Hereinafter, embodiments of the present invention will be described with reference to the drawings.

Figure 1:
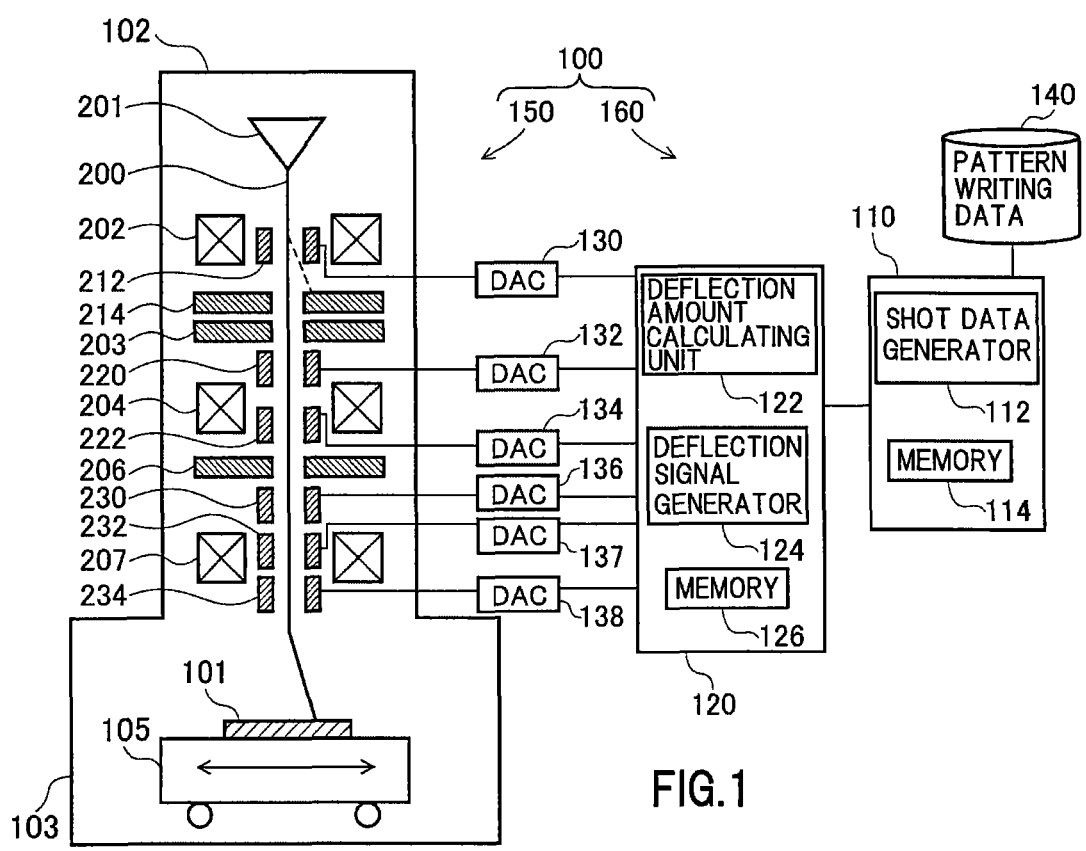
FIG. 1 is a diagram schematically illustrating an electron beam pattern writing apparatus according to an embodiment of the present invention.

FIG. 1 is a diagram schematically illustrating an electron beam pattern writing apparatus according to an embodiment of the present invention. An electron-beam pattern writing apparatus 100 is a changeable shaping pattern writing apparatus which includes a pattern writing unit 150 and a control unit 160.

The pattern writing unit 150 includes an electron-optical column 102 and a pattern writing chamber 103. Inside an electron-optical column 102, an electron gun assembly 201, an illumination lens 202, a blanker 212, a blanking aperture plate 214, a first shaping aperture plate 203, a projection lens 204, a first shaping deflector 220, a second shaping deflector 222, a second shaping aperture plate 206, an objective lens 207, a first objective main deflector 232, a second objective sub-deflector 230, and a third objective sub-sub-deflector 234 are disposed. In the following description, the first objective main deflector 232, the second objective sub-deflector 230, and the third objective sub-sub-deflector 234 are described as the main deflector 232, the sub-deflector 230, and the sub-sub-deflector 234, respectively.

The first shaping deflector 220 and the second shaping deflector 222 include eight pairs of (16) electrodes disposed circumferentially at an equal interval and are configured to deflect an electron beam by applying a voltage between electrodes facing each other.

An XY stage 105 is disposed in the pattern writing chamber 103. A mask (reticle) on which a resist is applied becomes a pattern writing target substrate, and a sample 101 such as a semiconductor wafer are disposed on the XY stage 105.

The control unit 160 includes a control calculator 110, a deflection control circuit 120, digital-analog conversion (DAC) units 130, 132, 134, 136, 137, and 138, and a storage device 140 such as a magnetic device apparatus. The control calculator 110, a deflection control circuit 120, and a storage device 140 are connected to each other via a bus (not illustrated). In addition, the deflection control circuit 120 and DAC units 130, 132, 134, and 136 to 138 are connected to each other via a bus (not illustrated).

The control calculator 110 includes a shot data generator 112 and a memory 114. The shot data generator 112 may be configured to be hardware, or may be configured to be software. Input/output data or data during calculating of the shot data generator 112 is appropriately stored in the memory 114.

The deflection control circuit 120 includes a deflection amount calculating unit 122, a deflection signal generator 124, and a memory 126. The deflection amount calculating unit 122 and a deflection signal generator 124 may be configured to be hardware, or may be configured to be software. Input/output data or data during calculating of the deflection amount calculating unit 122 and a deflection signal generator 124 is appropriately stored in the memory 126.

DAC unit 130 performs digital analog conversion of a blanking signal output from the deflection control circuit 120, amplifies the converted signal, and outputs a deflection voltage which is applied to the blanker 212.

DAC unit 132 performs digital analog conversion of a first shaping deflection signal output from the deflection control circuit 120, amplifies the converted signal, and outputs a deflection voltage which is applied to the first shaping deflector 220.

DAC unit 134 performs digital analog conversion of a second shaping deflection signal output from the deflection control circuit 120, amplifies the converted signal, and outputs a deflection voltage which is applied to the second shaping deflector 222.

DAC unit 136 performs digital analog conversion of a sub-deflection data signal output from the deflection control circuit 120, amplifies the converted signal, and outputs a deflection voltage which is applied to the sub-deflector 230.

DAC unit 137 performs digital analog conversion of a main deflection data signal output from the deflection control circuit 120, amplifies the converted signal, and outputs a deflection voltage which is applied to the main deflector 232.

DAC unit 138 performs digital analog conversion of a sub-sub deflection signal output from the deflection control circuit 120, amplifies the converted signal, and outputs a deflection voltage which is applied to the sub-sub-deflector 234.

Pattern writing data (layout data) which is configured to have a plurality of figure patterns is input from an external device and stored in the storage device 140 (storage unit).

When an electron beam 200 released from the electron gun assembly 201 (releasing unit) provided in the electron-optical column 102 passes in the blanker 212 (blanking deflector), the electron beam 200 is controlled by the blanker 212 to pass the blanking aperture plate 214 in a state of beam-ON and is deflected such that the entire beam is blocked by the blanking aperture plate 214 in a state of beam-OFF. When the state is switched from beam-OFF to beam-ON, the electron beam 200 that passes through the blanking aperture plate 214 after the beam-ON state to the beam-OFF state becomes one shot of electron beam.

The blanker 212 controls a direction of the electron beam 200 when passing such that the beam-ON state and the beam-OFF state are generated alternately. For example, in the beam-ON state, the deflection voltage is not applied to the blanker 212 and, in the beam-OFF state, the deflection voltage is applied to the blanker 212. An amount of irradiation for each shot of electron beam 200 with which the sample 101 is irradiated is regulated by irradiation time of each shot.

The entire first shaping aperture plate 203 that has a rectangular (rectangular or square) opening 32 (see FIG. 2) is irradiated with the electron beam 200 of each shot produced by passing through the blanker 212 and the blanking aperture plate 214 by the illumination lens 202. The electron beam 200 passes through the opening 32 of the first shaping aperture plate 203, thereby being formed into a rectangle.

The electron beam 200 of the first aperture plate image that passes through the first shaping aperture plate 203 is projected onto the second shaping aperture plate 206 having an opening 34 (see FIG. 2) by the projection lens 204. At this time, the deflection of the first aperture plate image that is projected onto second shaping aperture plate 206 is controlled by the first shaping deflector 220 and the second shaping deflector 222 and, thus, it is possible to change a shape and size (perform changeable shaping) of the electron beam that passes through the opening 34 as illustrated in FIG. 3 to be described later. Such a changeable shaping is performed, normally, to shape a different beam shape and/or size for each shot.

The electron beam 200 of the second aperture plate image that passes through the opening 34 of the second shaping aperture plate 206 is focused by the objective lens 207, is deflected through three stages by the main deflector 232, the sub-deflector 230, and the sub-sub-deflector 234, and a target position on the sample 101 disposed on the XY stage 105 that moves continuously is irradiated with the electron beam.

Figure 2:
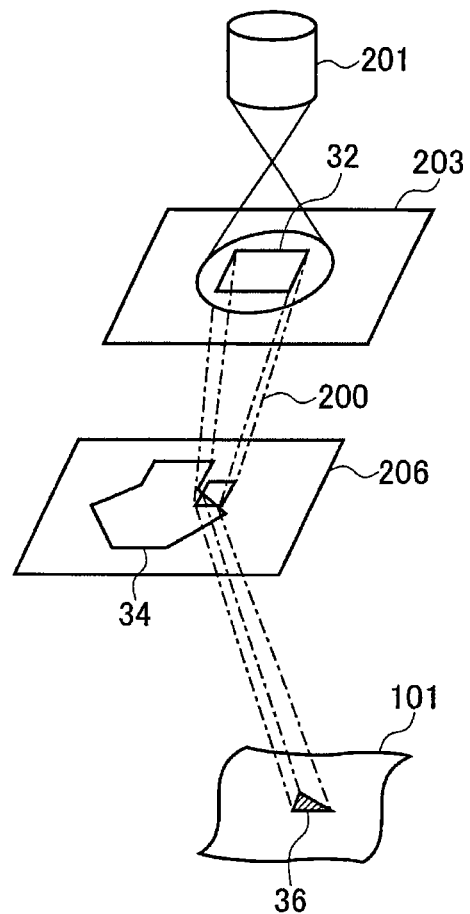
FIG. 2 is a view schematically illustrating beam shaping in the embodiment.
Figure 3:
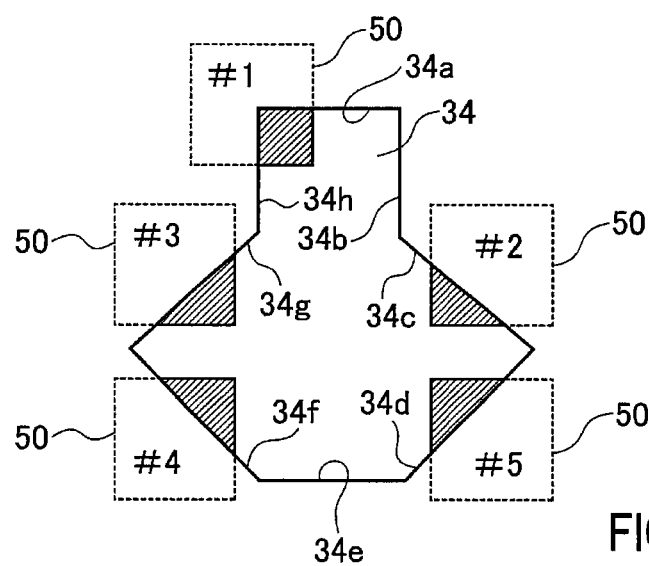
FIG. 3 is a diagram illustrating an example of an overlapped position between a first aperture plate image and a changeable shaping opening of a second shaping aperture plate.

FIG. 2 is an oblique perspective view schematically illustrating beam shaping by the first shaping aperture plate 203 and the second shaping aperture plate 206. The rectangular (rectangular or square) opening 32 for shaping the electron beam 200 is formed on the first shaping aperture plate 203. According to the present embodiment, the opening 32 is a square having a size of 0.5 µm to 0.6 µm.

In addition, the changeable shaping opening 34 for shaping the electron beam 200 that passes through the opening 32 of the first shaping aperture plate 203 into a desirable shape is formed on the second shaping aperture plate 206. The changeable shaping opening 34 has a shape to combine sides 34a and 34e parallel to a side of the opening 32, sides 34b, and 34h orthogonal thereto, and sides 34c, 34d, 34f, and 34g which form 45 degrees or 135 degrees with respect to a side of the opening 32.

To be more specific for the shape of the changeable shaping opening 34, the sides 34c and 34d are orthogonal to each other and the sides 34f and 34g are orthogonal to each other. Ends of the sides 34f and 34d are connected by the side 34e. One end side of each of the sides 34b and 34h is connected to the opposite ends of the side 34a orthogonally and the other end side of each of the sides 34b and 34h is connected to one end side of each of the 34c and 34g. The changeable shaping opening 34 has an octagonal shape which includes a hexagonal-shape portion surrounded by the sides 34c to 34g and a rectangular-shape portion surrounded by the sides 34a, 34b, and 34h and is connected to the hexagonal-shape portion.

The electron beam 200 that is emitted from the electron gun assembly 201 and passes through the opening 32 of the first shaping aperture plate 203 is deflected to a specific position on the second shaping aperture plate 206 without irradiating the changeable shaping opening 34 of the second shaping aperture plate 206, by the first shaping deflector 220, then, is caused to passes through the changeable shaping opening 34, and is deflected by the second shaping deflector 222 so as to form an electron beam having a desirable size and shape. With the electron beam that passes through a part of the changeable shaping opening 34 of the second shaping aperture plate 206 and has a desirable size and shape, the sample 101 mounted on the XY stage 105 that moves continuously in a predetermined direction (for example, an X direction) is irradiated. That is, pattern writing of a beam shape that can pass through both the opening 32 of the first shaping aperture plate 203 and the changeable shaping opening 34 of the second shaping aperture plate 206 is performed on a pattern writing region of the sample 101 mounted on the XY stage 105 which moves continuously in an X direction.

In the example of FIG. 2, the electron beam passes through the opening 32 of the first shaping aperture plate 203 such that the electron beam is first shaped to be rectangular. Next, a region including the side 34c formed in an angle of 135 degrees of the changeable shaping opening 34 of the second shaping aperture plate 206 is irradiated. As a result, among the rectangular electron beams shaped by the opening 32, only electron beams that reach inside of the changeable shaping opening 34 from the side 34c formed in 135 degrees of the changeable shaping opening 34 passes the changeable shaping opening 34 without being blocked by the second shaping aperture plate 206. Accordingly, the electron beam 200 is shaped to have an isosceles right triangle cross section perpendicular to a beam axis direction and the sample 101 is irradiated with a shot beam 36 having the isosceles right triangle.

FIG. 3 is a plan view illustrating an example of an overlapped position between the first aperture plate image 50 that passes through the opening 32 of the first shaping aperture plate 203 and the changeable shaping opening 34 of the second shaping aperture plate 206.

In a case where the electron beam 200 is formed to be rectangular, the first aperture plate image 50 is deflected by the first shaping deflector 220 and the second shaping deflector 222 and a position represented by #1 is irradiated therewith. An image is obtained, in which the shaded portion that passes through the changeable shaping opening 34 is shaped.

In a case where the electron beam 200 is shaped into an isosceles right triangle of which the right angle is positioned on the lower left side, the first aperture plate image 50 is deflected by the first shaping deflector 220 and the second shaping deflector 222, and a position represented by #2 on the side 34c is irradiated therewith. An image is obtained, in which the shaded portion that passes through the changeable shaping opening 34 is shaped.

In a case where the electron beam 200 is shaped into an isosceles right triangle of which the right angle is positioned on the lower right side, the first aperture plate image 50 is deflected by the first shaping deflector 220 and the second shaping deflector 222, and a position represented by #3 on the side 34g is irradiated therewith. An image is obtained, in which the shaded portion that passes through the changeable shaping opening 34 is shaped.

In a case where the electron beam 200 is shaped into an isosceles right triangle of which the right angle is positioned on the upper right side, the first aperture plate image 50 is deflected by the first shaping deflector 220 and the second shaping deflector 222, and a position represented by #4 on the side 34f is irradiated therewith. An image is obtained, in which the shaded portion that passes through the changeable shaping opening 34 is shaped.

In a case where the electron beam 200 is shaped into an isosceles right triangle of which the right angle is positioned on the upper left side, the first aperture plate image 50 is deflected by the first shaping deflector 220 and the second shaping deflector 222, and a position represented by #5 on the side 34d is irradiated therewith. An image is obtained, in which the shaded portion that passes through the changeable shaping opening 34 is shaped.

Figure 4A:
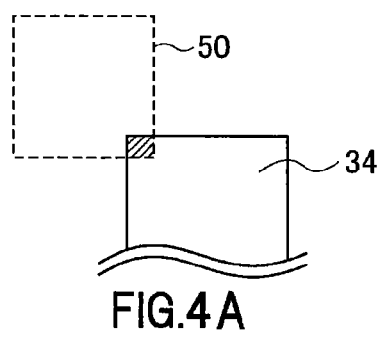
FIGS. 4A and 4B are views illustrating examples of a portion of the first aperture plate image, which passes through the changeable shaping opening.
Figure 4B:
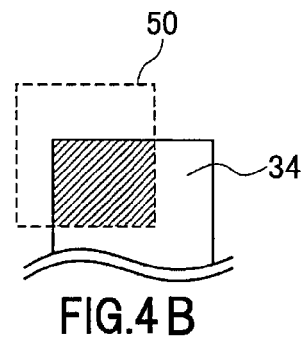
Figure 5A:
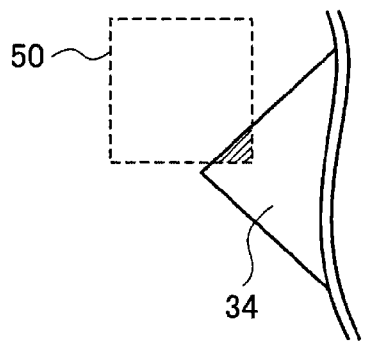
FIGS. 5A and 5B are views illustrating examples of a portion of the first aperture plate image, which passes through the changeable shaping opening.
Figure 5B:
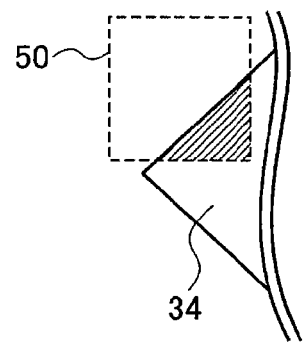

As illustrated in FIGS. 4A and 4B and FIGS. 5A and 5B, a size of a portion of the first aperture plate image 50 that passes through the changeable shaping opening 34 is changed and, thereby, a size of an image (shot) changes maintaining the rectangular shape or the similar isosceles right triangles. In FIG. 4A, the first aperture plate image and the changeable shaping opening 34 have a small overlapped portion and, thereby a small-sized rectangular image is formed. In FIG. 4B, the first aperture plate image and the changeable shaping opening 34 have a large overlapped portion and, thereby a large-sized rectangular image is formed. In FIG. 5A, the first aperture plate image and the changeable shaping opening 34 have a small overlapped portion and, thereby a small-sized isosceles right triangle image is formed. In FIG. 5B, the first aperture plate image 50 and the changeable shaping opening have a large overlapped portion and, thereby a large-sized isosceles right triangle image is formed.

In this way, an irradiation position (deflected position) of the first aperture plate image 50 on the second shaping aperture plate 206 is changed and, thereby, it is possible to shape the electron beam 200 into five types of figures (one rectangle and four types of isosceles right triangles) with desirable sizes.

Figure 6A:
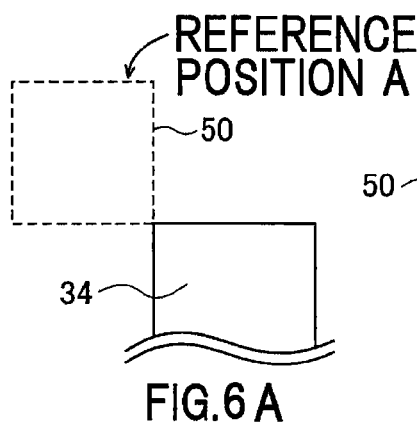
FIGS. 6A, 6B and 6C are views illustrating examples of a position of a deflected first aperture plate image.
Figure 6B:
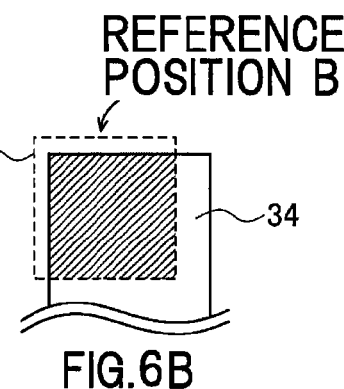
Figure 6C:
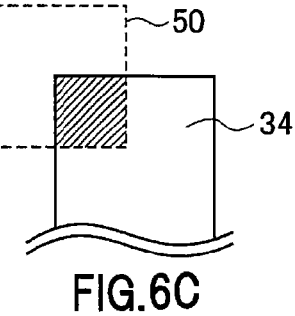
Figure 7A:
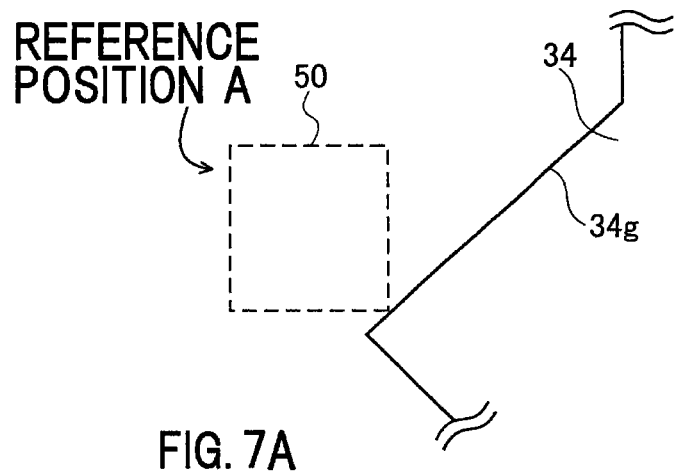
FIGS. 7A, 7B and 7C are views illustrating examples of a position of the deflected first aperture plate image.
Figure 7B:
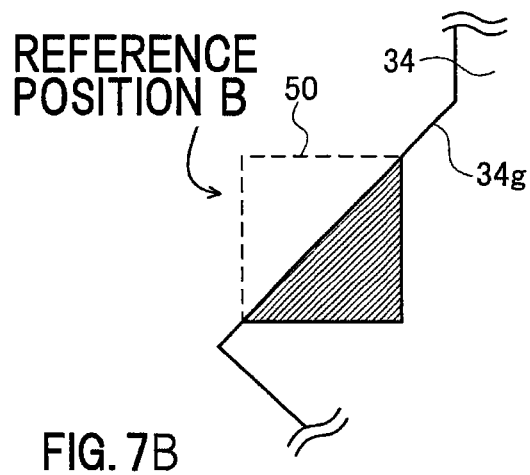

According to the present embodiment, the first shaping deflector 220 positions the first aperture plate image 50 at a reference position A which is blocked as illustrated in FIG. 6A or FIG. 7A or at a reference position B at which a maximum size of a shot is obtained as illustrated in FIG. 6B or FIG. 7B. The second shaping deflector 222 causes the first aperture plate image 50 to move to an intermediate position or to half of the intermediate position as illustrated in FIG. 6C or FIG. 7C and a shot beam having a target shape and size is formed.

Figure 7C:
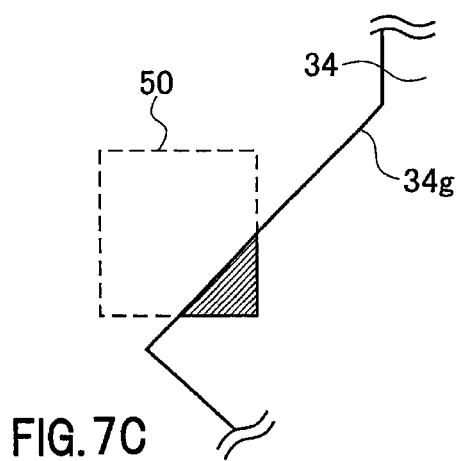

The position of the first aperture plate image 50 illustrated in FIG. 6A and FIG. 7A is set as a position with 0% of a shot size, the position of the first aperture plate image 50 illustrated in FIG. 6B and FIG. 7B is set as a position with 100% of a shot size, and the position of the first aperture plate image 50 illustrated in FIG. 6C and FIG. 7C is set as a position with 25% of a shot size. In this case, the first shaping deflector 220 positions the first aperture plate image 50 at the position of 0% or at the position of 100%.

When the shot size is 0%, the entire first aperture plate image 50 is blocked by the second shaping aperture plate 206 and the sample 101 is not irradiated with the electron beam. For example, in FIG. 6A, a vertex of the first aperture plate image 50 meets a vertex of the quadrangle surrounded by the sides 34a, 34b, and 34h. In FIG. 7A, a vertex of the first aperture plate image 50 is positioned on a side 34g.

When the shot size is 100%, the maximum setting range of the shot size is obtained and, thus, corresponds to the maximum shot size. For example, in FIG. 6B, nearly the entire first aperture plate image 50 is overlapped with the changeable shaping opening 34 and the maximum size setting range of the rectangular image is obtained. In FIG. 7B, the size 34g is positioned on a diagonal line of the first aperture plate image 50 and the maximum size setting range of the isosceles right triangle image is obtained.

When the shot size is 25%, the shot size corresponds to 25% of the maximum shot size. The overlapped area of the first aperture plate image 50 with the changeable shaping opening 34 in FIG. 6C is 25% of the overlapped area of the first aperture plate image 50 with the changeable shaping opening 34 in FIG. 6B. Similarly, the overlapped area of the first aperture plate image 50 with the changeable shaping opening 34 in FIG. 7C is 25% of the overlapped area of the first aperture plate image 50 with the changeable shaping opening 34 in FIG. 7B.

In a case where a target shot size is less than 25% of the maximum shot size, the first shaping deflector 220 positions the first aperture plate image 50 at the position of 0% and, then, the second shaping deflector 222 deflects (moves) the first aperture plate image 50 by the target shot size in a direction toward the position of 25% from the position of 0% by the target shot size.

In a case where a target shot size is in a range of 25% to 100% of the maximum shot size, the first shaping deflector 220 positions the first aperture plate image 50 at the position of 100% and, then, the second shaping deflector 222 deflects the first aperture plate image 50 by the target shot size in a direction toward the position of 25% from the position of 100%.

In a case where the maximum movement distance of the first aperture plate image 50 by the deflection of the second shaping deflector 222 in a vertical direction is L in each of a vertical direction and a horizontal direction in FIGS. 6A, 6B and 6C, in a method in the related art in which the first aperture plate image 50 is caused to move from the position of 0% to the position of 100%, a distance (interval) between the position of 0% to the position of 100% is limited to be equal to or less than L in each of the vertical direction and the horizontal direction.

On the other hand, in the method according to the present embodiment, there are provided both a first pattern writing mode in which the first aperture plate image 50 is caused to move from the position of 0% to the position of 25% and a second pattern writing mode in which the first aperture plate image 50 is caused to move from the position of 100% to the position of 25%. Therefore, even when the distance (interval) between the position of 0% and the position of 100% is 2 L in each of the vertical direction and the horizontal direction, it is possible to position the first aperture plate image 50 at any location between the position of 0% and the position of 100% by the second shaping deflector 222.

Figure 8A:
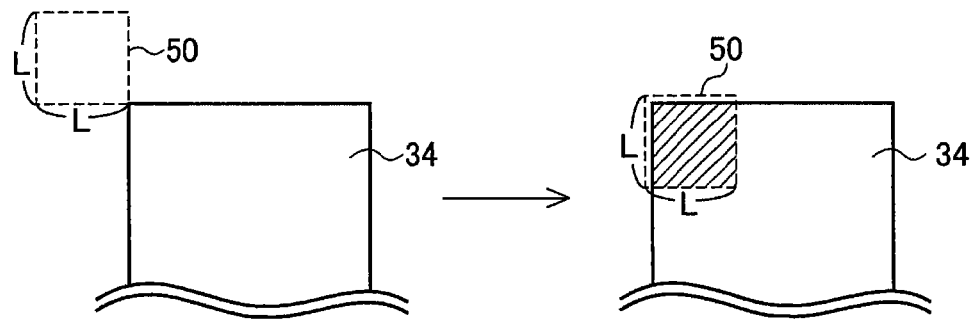
FIGS. 8A and 8B are views illustrating examples of a position of the deflected first aperture plate image according to a comparative example.
Figure 8B:
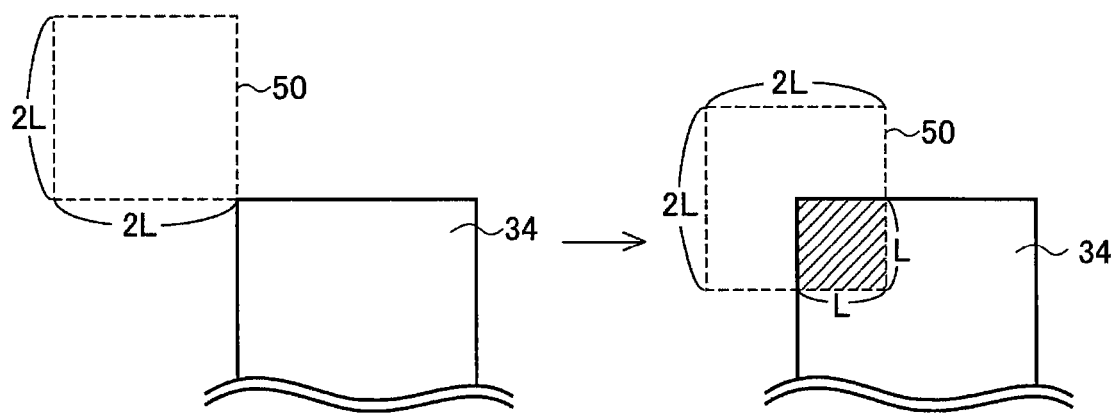

In a case where the maximum movement distance of the first aperture plate image 50 through the deflection by the second shaping deflector 222 is L and the size of the first aperture plate image 50 is L, even in a related art, as illustrated in FIG. 8A, it is possible to cause the first aperture plate image 50 to move between the position of 0% and the position of 100%. However, in a case where the size of the first aperture plate image 50 is 2 L, in a related art, as illustrated in FIG. 8B, the first aperture plate image 50 can move only between the position of 0% and the position of 25%.

Figure 9:
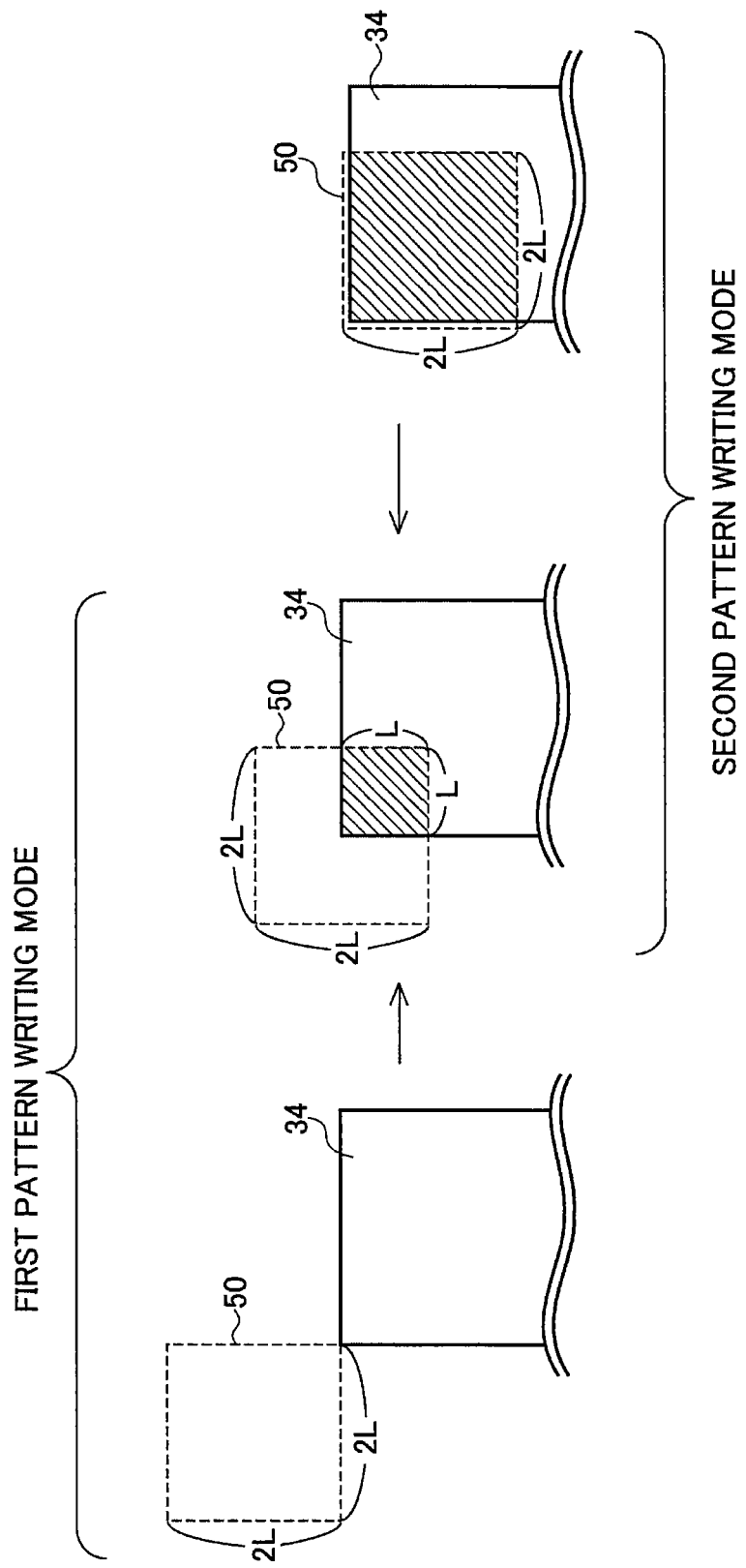
FIG. 9 is a view illustrating an example of a position of the deflected first aperture plate image.

Meanwhile, in the method according to the present embodiment, as illustrated in FIG. 9, in the first pattern writing mode, the first aperture plate image 50 is positioned at the position of 0% by the first shaping deflector 220 and the first aperture plate image 50 is caused to move from the position of 0% to the position of 25% by the second shaping deflector 222. In the second pattern writing mode, the first aperture plate image 50 is positioned at the position of 100% by the first shaping deflector 220 and the first aperture plate image 50 is caused to move from the position of 100% to the position of 25% by the second shaping deflector 222. Therefore, even when the maximum movement distance of the first aperture plate image 50 through the deflection by the second shaping deflector 222 is L and the size of the first aperture plate image 50 is 2 L, it is possible to position the first aperture plate image 50 at any location between the position of 0% and the position of 100%.

In this way, since the movement range of the first aperture plate image 50 is increased, it is possible to position the first aperture plate image 50 at any location between the position of 0% and the position of 100% even when the area of the first aperture plate image 50 is increased to be four times the area of the first aperture plate image 50 in a case of the method of the related art.

According to the present embodiment, the electron-beam pattern writing apparatus 100 includes two pattern writing modes of highly accurate pattern writing and high throughput pattern writing and the first shaping deflector 220 and the second shaping deflector 222 are controlled depending on the pattern writing mode. In the highly accurate pattern writing, the first shaping deflector 220 deflects the rectangular first aperture plate image 50 to a position (position illustrated in FIG. 6A or FIG. 7A) at which the first aperture plate image 50 is completely blocked by the second shaping aperture plate 206 and the second shaping deflector 222 deflects the first aperture plate image 50 in a direction in which the shot size becomes greater (a portion that passes through the changeable shaping opening 34 is increased).

In the high throughput pattern writing, the first shaping deflector 220 deflects the first aperture plate image 50 to a position of the maximum shot size (position illustrated in FIG. 6B or FIG. 7B) and the second shaping deflector 222 deflects the first aperture plate image 50 in a direction in which the shot size becomes smaller (a portion that passes through the changeable shaping opening 34 is decreased).

The highly accurate pattern writing has the shot size that is smaller than the high throughput pattern writing and it is possible to perform pattern writing of a minute pattern with higher accuracy. Since the high throughput pattern writing has the shot size that is greater than the highly accurate pattern writing, the number of shots for pattern writing of a pattern is decreased and it is possible to increase the pattern writing throughput and to shorten pattern writing time.

In this way, in a case where the opening 32 of the first shaping aperture plate 203 is large and the size of the first aperture plate image 50 is large, the reference positions of the first aperture plate image 50 is switched by the first shaping deflector 220 using the pattern writing modes and, thereby, it is possible to form both a minute shot size and a large shot size. The first shaping deflector 220 not only determines a shape of a shot, but also can switch the reference positions (the position of 0% and the position of 100%) of the first aperture plate image 50 depending on the shot size.

Figure 10:
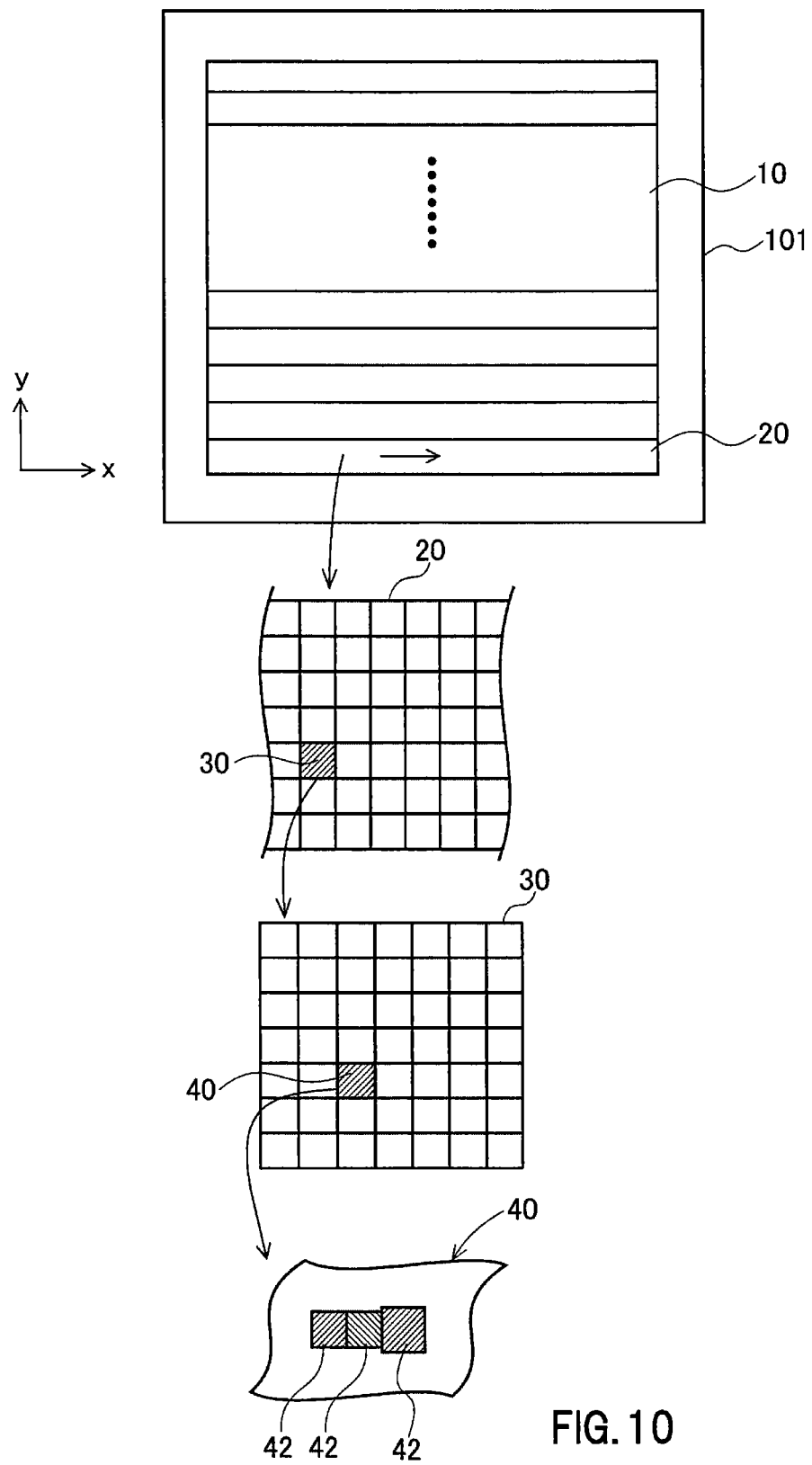
FIG. 10 is a diagram schematically illustrating a pattern writing region.

FIG. 10 is a diagram schematically illustrating a pattern writing region. In FIG. 10, a pattern writing region 10 of the sample 101 is virtually divided into a plurality of stripe regions 20 in a strip shape in, for example, a y direction with a width with which the main deflector 232 can perform deflection. In addition, each stripe region 20 is virtually divided into a plurality of sub-fields (SF) 30 in a mesh shape with a size with which the sub-deflector 230 can perform deflection. Each SF 30 is virtually divided into a plurality of under-sub-field (USF; here, referred to as "TF" abbreviated from Tertiary Field which means a third deflection region) 40 in a mesh shape with a size with which the sub-sub-deflector 234 can perform deflection. A shot figure is subjected to pattern writing onto each shot position 42 of each TF 40. The number of divisions of TF in each SF is desirably determined in an extent that the pattern writing operation is not affected by thermal diffusion calculation. For example, it is preferable that 10 or less of TFs are formed vertically and horizontally, and further preferably, five or less of TFs vertically and horizontally.

When pattern writing is performed on the sample 101 using the shaped electron beam 200, first, the main deflector 232 deflects the shaped electron beam 200 to a reference position of the SF 30 that is subjected to shot. In order to move the XY stage 105, the main deflector 232 deflects the electron beam 200 so as to follow the movement of the XY stage 105. The sub-deflector 230 deflects the shaped electron beam 200 from the reference position of the SF 30 to the reference position of the TF 40 in the SF 30 which is subjected to shot. With the electron beam 200 deflected by the sub-sub-deflector 234, each position in the TF 40 is irradiated.

In performing such a pattern writing operation, first, the shot data generator 112 reads pattern writing data (pattern data) from the storage device 140, performs multi-stage data conversion processes, and generates device-specific shot data. A plurality of shapes and positions of figure patterns are defined in the pattern writing data. In addition, it is set in the pattern writing data whether each figure pattern is a pattern for highly accurate pattern writing in which pattern writing is performed with high accuracy or whether each figure pattern is a pattern for high speed pattern writing (pattern for low accurate pattern writing) in which pattern writing is performed rapidly and high accuracy is not needed. For example, in a case where the sample 101 is a mask for forming a semiconductor device on a wafer or the like, a figure pattern for forming a semiconductor circuit is set as a pattern for highly accurate pattern writing and a figure pattern for forming a bar code, ID number, or the like is set as a pattern for high speed pattern writing.

The shot data generator 112 divides a figure pattern defined in the pattern writing data by the maximum shot size that can be irradiated by one beam shot and generates a shot figure. At this time, the shot data generator 112 divides the figure pattern by the maximum shot size in the highly accurate pattern writing in a case where the figure pattern to be divided is a pattern for the highly accurate pattern writing, and divides the figure pattern by the maximum shot size in the high throughput pattern writing in a case where the figure pattern to be divided is a pattern for the high speed pattern writing. The maximum shot size that divides the pattern for the high speed pattern writing is greater than the maximum shot size that divides the pattern for the highly accurate pattern writing and it is possible to decrease the number of division.

After division of the figure pattern, the shot data generator 112 generates shot data for each shot figure. For example, type of figure, size of figure, irradiation position, irradiation time, or the like is defined in the shot data. A deflection amount of the first shaping deflector 220 is controlled by the "type of figure" included in the shot data and a deflection amount of the second shaping deflector 222 is controlled by a "size of figure". According to the present embodiment, even when the shapes of figures are the same, a deflection amount by the first shaping deflector 220 is different depending on the size. Therefore, even when the shape is the same, "type of figure" of the shot data is different depending on whether the size of a figure is equal to or less than a predetermined value (highly accurate pattern writing) or whether the size is greater than the predetermined value (high throughput pattern writing).

The shot data generator 112 allocates each item of shot data to the TF 40 in which the shot figure is disposed. In addition, the shot data generator 112 sets an order of pattern writing processes of the plurality of TFs in the SF for each SF 30.

The shot data generator 112 sorts out the shot data allocated to each TF 40 and sets a shot order. Change of the type of the figure requires control of a deflection amount of the first shaping deflector 220 and longer settling time for the DAC units is needed than the change of size of the figure only by the second shaping deflector 222. Therefore, the items of shot data are grouped by the type of figures and are sorted out and the shot order is set. Accordingly, it is possible to decrease the number of changes of the types of the figures and to shorten the pattern writing time.

As a case where the types of figures are different, as described above, there are a case of different shape and a case of different size while the shape is the same. Change in a deflection amount of the first shaping deflector 220 depending on the change of the type of the figures is less in the case where the shape is the same but size is different than in the case where the shape is different. In addition, short settling time is needed for the DAC units. Therefore, when the items of shot data are grouped by the shapes and the types of figures and are sorted out and a shot order is set, it is possible to further shorten the pattern writing time.

The shot data generated as above is stored in the memory 114.

The deflection control circuit 120 receives the shot data stored in the memory 114 from the control calculator 110. The deflection amount calculating unit 122 calculates each deflection amount of the blanker 212, the first shaping deflector 220, the second shaping deflector 222, the main deflector 232, the sub-deflector 230 and the sub-sub-deflector 234 by using the input shot data.

The deflection signal generator 124 generates a blanking signal from the deflection amount in the blanker 212 and outputs the signal to the DAC unit 130. In addition, the deflection signal generator 124 generates a first shaping deflection signal from the deflection amount in the first shaping deflector 220 and outputs the signal to the DAC unit 132. In addition, the deflection signal generator 124 generates a second shaping deflection signal from the deflection amount in the second shaping deflector 222 and outputs the signal to the DAC unit 134. In addition, the deflection signal generator 124 generates a main deflection data signal from the deflection amount in the main deflector 232 and outputs the signal to the DAC unit 137. In addition, the deflection signal generator 124 generates a sub-deflection data signal from the deflection amount in the sub-deflector 230 and outputs the signal to the DAC unit 136. In addition, the deflection signal generator 124 generates a sub-sub-deflection data signal from the deflection amount in the sub-sub-deflector 234 and outputs the signal to the DAC unit 138.

The DAC units 130, 132, 134, and 136 to 138 generate a deflection voltage based on the signals output from the deflection signal generator 124 and the voltage is applied to each electrode of the corresponding deflector. Accordingly, it is possible to irradiate a desired position on the sample 101 with a desirable shape of electron beam.

In the electron-beam pattern writing apparatus 100 according to the present embodiment, the first shaping deflector 220 determines not only the shot shape but also the range of the shot size and, thereby, the deflection position of the first aperture plate image 50 is switched in accordance with the shot size even with the same shape. Therefore, even in a case where the opening 32 of the first shaping aperture plate 203 is large and the deflection amount of the second shaping deflector 222 is small, it is possible to form from a minute shot size to the maximum shot size by the first aperture plate image 50. It is possible to perform pattern writing for a minute pattern by an electron beam having a minute shot size with high accuracy. In addition, a pattern that is not require accuracy, the pattern writing is formed by a large-sized electron beam, and thereby the number of shots is decreased and it is possible to shorten the pattern writing time and increase the pattern writing throughput.

According to embodiment described above, it is preferable that the maximum shot size used during the highly accurate pattern writing and the minimum shot size used during the high throughput pattern writing are similar to each other. The maximum shot size used during the highly accurate pattern writing is determined by the maximum deflection amount by the second shaping deflector 222, the size of the opening 32 of the first shaping aperture plate 203, or the like and, for example, is about ¼ to ½ of the maximum shot size used during the high throughput pattern writing.

According to embodiment described above, the shot shape and the reference position (range of shot size) of the aperture plate image 50 are determined by the deflection amount of the first shaping deflector 220 and thereby the electron beam 200 can form five types of figures of one rectangle and four types of isosceles right triangles; however, even when the shape is the same, "type of figure" in the shot data is different as a small figure and a large figure. Therefore, in a case where these figures are grouped separately, the first shaping deflector 220 can form the electron beam 200 by total ten types of figures of a small rectangle, a large rectangle, and four types of small and large isosceles right triangles.

The switching of reference positions of the first aperture plate image 50 depending on the shot size may be applied to all of the shot shapes of the rectangle and four types of the isosceles right triangles or may be applied only to the rectangle.

According to the embodiment described above, two ranges of shot sizes are set so as to correspond to the two pattern writing mode of the highly accurate pattern writing and the high throughput pattern writing; however, three or more pattern writing modes may be provided and ranges of shot sizes corresponding to pattern writing modes may be set. For example, in a case where three pattern writing modes of the highly accurate pattern writing, normal pattern writing, and the high throughput pattern writing are provided, three ranges of shot sizes are set so as to correspond to the pattern writing modes. The maximum shot size used during the normal pattern writing is greater than the maximum shot size used during the highly accurate pattern writing and smaller than the maximum shot size used during the high throughput pattern writing.

In this case, the reference positions of the first aperture plate image 50 is, for example, three positions of the position of 0%, the position of 25%, and the position of 100%. In the highly accurate pattern writing, the second shaping deflector 222 causes the first aperture plate image 50 to move from the position of 0% to the position of 11%, in the normal pattern writing, to move from the position of 25% to the position of 11% to the position of 44%, and in the high throughput pattern writing, to move from the position of 100% to the position of 44%.

As above, three or more of pattern writing modes are provided and, thereby, the opening 32 of the first shaping aperture plate 203 becomes greater. Even in a case where the deflection amount of the second shaping deflector 222 is small, it is possible to shape from a minute shot size to a large shot size. Since it is possible to perform the pattern writing using the shot size in accordance with the obtained pattern writing accuracy, the pattern writing is performed with the minute pattern with high accuracy, the number of the entire shots is decreased, and it is possible to shorten the pattern writing time for an entire pattern.

According to the embodiment described above, the electron beam is used; however the present invention is not limited thereto, and the invention can be applied to a case where another charged particle beam such as an ion beam is used.

The present invention is not limited to the embodiments described above as is; however, when applied to the field, it is possible embody the invention by modifying the components without departing from the spirit and scope of the invention. In addition, a plurality of components described above can be appropriately combined and, thereby, various inventions can be formed. For example, a few of the entire components described above in the embodiments may be removed. Further, components in different embodiments may be appropriately assembled.

What is claimed is:

1. An electron beam writing apparatus comprising:
   an electron gun assembly that emits an electron beam so as to perform pattern writing on a sample;
   a first aperture plate that shapes the electron beam;
   a second aperture plate onto which the electron beam of an aperture plate image passing through the first aperture plate is projected; and a first shaping deflector and a second shaping deflector which are provided between the first aperture plate and the second aperture plate, respectively, deflect the electron beam, control an irradiation position of the aperture plate image on the second aperture plate, and determine a shape and a shot size of the electron beam that passes through the second aperture plate, wherein the first shaping deflector deflects an electron beam such that the aperture plate image is positioned at a determined position in accordance with a shape and a shot size of an electron beam with which the sample is irradiated, and wherein the second shaping deflector deflects an electron beam deflected by the first shaping deflector and controls formation of a desirable shot size.

2. The apparatus according to claim 1, wherein, in a case where a size of an electron beam with which the sample is irradiated is equal to or less than a predetermined value, the first shaping deflector deflects the electron beam such that the entire aperture plate image is blocked by the second aperture plate, and wherein, in a case where a size of an electron beam with which the sample is irradiated is greater than the predetermined value, the first shaping deflector deflects the electron beam such that an area of the aperture plate image that passes through the second aperture plate becomes the largest.

3. The apparatus according to claim 2, further comprising:

a shot data generator that reads a pattern writing data, in which shapes and positions of a plurality of figure patterns, and whether each figure pattern is a pattern of a highly accurate pattern writing or a pattern of a high speed pattern writing are defined, from a storage unit, divides a figure pattern which is defined in the pattern writing data by a maximum shot size that is possibly irradiated by one shot of an electron beam, and generates shot data for each divided shot figure; and a deflection controller that generates a deflection signal for controlling the first shaping deflector and the second shaping deflector from the shot data, wherein a maximum shot size that divides a figure pattern which is the pattern of the highly accurate pattern writing is less than a maximum shot size that divides a figure pattern which is the pattern of the high speed pattern writing.

4. The apparatus according to claim 3, wherein the shot data generator groups the shot data on the basis of a shape of the shot figure and whether a size of the shot figure is equal to or less than the predetermined value and sets an order of the shots.

5. The apparatus according to claim 3, wherein the maximum shot size that divides the figure pattern which is the pattern of the highly accurate pattern writing is set to be ¼ to ½ of the maximum shot size that divides the figure pattern which is the pattern of the high speed pattern writing.

6. The apparatus according to claim 3, wherein in the pattern writing data, a figure pattern for forming a semiconductor circuit is set to be a pattern of a highly accurate pattern writing and a figure pattern for forming a bar code or an ID number is set to be a pattern of a high speed pattern writing.

7. The apparatus according to claim 1, further comprising:

a shot data generator that reads a pattern writing data, in which shapes and positions of a plurality of figure patterns, and whether each figure pattern is a pattern of a highly accurate pattern writing, a pattern of a normal pattern writing, or a pattern of a high speed pattern writing are defined, from a storage unit, divides a figure pattern which is defined in the pattern writing data by the maximum shot size that is possibly irradiated by one shot of an electron beam, and generates shot data for each divided shot figure; and a deflection controller that generates a deflection signal for controlling the first shaping deflector and the second shaping deflector from the shot data, wherein a maximum shot size that divides the figure pattern which is the pattern of the normal pattern writing is less than the maximum shot size that divides a figure pattern which is the pattern of the high speed pattern writing and greater than the maximum shot size that divides a figure pattern which is the pattern of the highly accurate pattern writing.

8. The apparatus according to claim 1, wherein an opening of an octagonal shape which includes a hexagonal-shape portion and a rectangular-shape portion that is in contact with the hexagonal-shape portion is provided in the second aperture plate, wherein a vertex portion of the rectangular-shape portion is irradiated with an electron beam and a shape of the electron beam becomes a rectangle, and wherein a side portion of the hexagonal-shape portion is irradiated with an electron beam and a shape of the electron beam becomes an isosceles right triangle.

9. An electron beam writing method comprising:

emitting an electron beam from an electron gun assembly;

shaping the electron beam that passes through a first aperture plate using a second aperture plate that is provided below the first aperture plate, and a first shaping deflector and a second shaping deflector which are provided between the first aperture plate and the second aperture plate; and irradiating a sample with the electron beam that passes through the second aperture plate, wherein the first shaping deflector controls a deflection amount of an electron beam on the basis of a shape of an electron beam with which the sample is irradiated and whether a size of the electron beam with which the sample is irradiated is equal to or less than a predetermined value, and wherein the second shaping deflector controls a deflection amount of an electron beam on the basis of a size of the electron beam with which the sample is irradiated.

10. The method according to claim 9, wherein, in a case where a size of an electron beam with which the sample is irradiated is equal to or less than the predetermined value, the first shaping deflector controls a deflection amount such that the entire electron beam that passes through the first aperture plate is blocked by the second aperture plate, and wherein, in a case where a size of an electron beam with which the sample is irradiated is greater than the predetermined value, the first shaping deflector controls a deflection amount such that an area of an electron beam that passes through the second aperture plate becomes the largest.

11. The method according to claim 10, further comprising:

reading a pattern writing data, in which shapes and positions of a plurality of figure patterns and whether each figure pattern is a pattern of a highly accurate pattern writing or a pattern of a high speed pattern writing are defined, from a storage unit;

dividing a figure pattern which is defined in the pattern writing data by a maximum shot size that is possibly irradiated by one shot of an electron beam, and generating shot data for each divided shot figure; and generating a deflection signal for controlling the first shaping deflector and the second shaping deflector from the shot data, wherein a maximum shot size that divides the figure pattern which is the pattern of the highly accurate pattern writing is less than a maximum shot size that divides a figure pattern which is the pattern of the high speed pattern writing.

12. The method according to claim 11, wherein the shot data is grouped on the basis of a shape of the shot figure and whether a size of the shot figure is equal to or less than the predetermined value and an order of the shots is set.

13. The method according to claim 11, wherein the maximum shot size that divides the figure pattern which is the pattern of the highly accurate pattern writing is set to be ¼ to ½ of the maximum shot size that divides the figure pattern which is the pattern of the high speed pattern writing.

14. The method according to claim 11, wherein, in the pattern writing data, a figure pattern for forming a semiconductor circuit is set to be a pattern of a highly accurate pattern writing and a figure pattern for forming a bar code or an ID number is set to be a pattern of a high speed pattern writing.

15. The method according to claim 9, further comprising:

reading a pattern writing data, in which shapes and positions of a plurality of figure patterns, and whether each figure pattern is a pattern of a highly accurate pattern writing, a pattern of a normal pattern writing, or a pattern of a high speed pattern writing are defined, from a storage unit;

dividing a figure pattern which is defined in the pattern writing data by the maximum shot size that is possibly irradiated by one shot of an electron beam, and generating shot data for each divided shot figure; and generating a deflection signal for controlling the first shaping deflector and the second shaping deflector from the shot data, wherein a maximum shot size that divides the figure pattern which is the pattern of the normal pattern writing is less than the maximum shot size that divides a figure pattern which is the pattern of the high speed pattern writing and is greater than the maximum shot size that divides a figure pattern which is the pattern of the highly accurate pattern writing.

\* \* \* \* \*